United States Patent
Collins et al.

(10) Patent No.: US 10,958,075 B2
(45) Date of Patent: Mar. 23, 2021

(54) AC POWER SOURCE

(71) Applicant: GE Aviation Systems Limited, Gloucestershire (GB)

(72) Inventors: John Oliver Collins, Cheltenham (GB); Colin John Halsey, Tewkesbury (GB); Russell Mark Compton, Droitwich Spa (GB)

(73) Assignee: GE Aviation Systems Limited, Gloucestershire (GB)

( * ) Notice: Subject to any disclaimer, the term of this patent is extended or adjusted under 35 U.S.C. 154(b) by 105 days.

(21) Appl. No.: 16/282,790

(22) Filed: Feb. 22, 2019

(65) Prior Publication Data

US 2019/0273380 A1 Sep. 5, 2019

(30) Foreign Application Priority Data

Mar. 5, 2018 (GB) ..................................... 1803517

(51) Int. Cl.

| | |
|---|---|
| *H02J 3/38* | (2006.01) |
| *B60R 16/03* | (2006.01) |
| *H02J 9/04* | (2006.01) |
| *H02J 3/14* | (2006.01) |
| *H02J 4/00* | (2006.01) |
| *H02J 9/06* | (2006.01) |
| *H02J 7/00* | (2006.01) |

(Continued)

(52) U.S. Cl.
CPC ................ *H02J 3/38* (2013.01); *B60R 16/03* (2013.01); *G05B 19/04* (2013.01); *H02J 3/14* (2013.01); *H02J 4/00* (2013.01); *H02J 7/0063* (2013.01); *H02J 9/04* (2013.01); *H02J 9/062* (2013.01); *B64D 2221/00* (2013.01); *G01R 31/42* (2013.01); *H02J 2310/44* (2020.01)

(58) Field of Classification Search
CPC ........ H02J 3/38; H02J 9/04; H02J 3/14; H02J 4/00; H02J 2310/44; H02J 2007/0067; H02J 7/0063; H02J 9/062; G05B 19/04; H02M 7/49; G01R 31/42
USPC .......................... 307/71, 77, 82; 363/71, 120
See application file for complete search history.

(56) References Cited

U.S. PATENT DOCUMENTS

| | | |
|---|---|---|
| 3,867,643 A | 2/1975 | Baker et al. |
| 5,764,502 A | 6/1998 | Morgan et al. |

(Continued)

FOREIGN PATENT DOCUMENTS

| | | |
|---|---|---|
| EP | 2899869 A1 | 7/2015 |
| WO | 9941828 A1 | 8/1999 |

(Continued)

OTHER PUBLICATIONS

Great Britain Search Report and Written Opinion dated Jul. 30, 2018 which was issued in connection with GB 1803517.0 which was filed on Mar. 5, 2018.

(Continued)

*Primary Examiner* — Arnold M Kinkead
(74) *Attorney, Agent, or Firm* — McGarry Bair PC

(57) ABSTRACT

An alternating-current power source can include a set of power storage units arranged in series and defining a power output. Each power storage unit can include a power storage device, a first connection configured to enable a voltage output of the power storage device, and a second connection configured to enable bypassing the voltage output of the power storage device.

18 Claims, 9 Drawing Sheets

(51) Int. Cl.
    *G01R 31/42*     (2006.01)
    *G05B 19/04*     (2006.01)

(56) References Cited

U.S. PATENT DOCUMENTS

| | | |
|---|---|---|
| 5,939,800 A | 8/1999 | Artinian et al. |
| 7,439,634 B2 | 10/2008 | Michalko |
| 7,800,245 B2 | 9/2010 | Michalko |
| 7,847,436 B2 * | 12/2010 | Blackmond ............ H02M 7/49 307/71 |
| 8,314,588 B2 | 11/2012 | Lazarovich et al. |
| 9,172,272 B2 | 10/2015 | Malo |
| 2006/0044857 A1 | 3/2006 | Lemak |
| 2014/0333126 A1 | 11/2014 | Vyas |
| 2015/0165990 A1 | 6/2015 | Iwashima et al. |
| 2015/0249351 A1 | 9/2015 | Wolff et al. |

FOREIGN PATENT DOCUMENTS

| | | |
|---|---|---|
| WO | 2012033958 A1 | 3/2012 |
| WO | 2017182091 A1 | 10/2017 |
| WO | 2017223267 A1 | 12/2017 |

OTHER PUBLICATIONS

Intellectual Property Office, Examination Report under Section 18(3) re Corresponding Application No. 323496-GB-1, dated Jun. 4, 2020, 3 pages, South Wales, NP.

\* cited by examiner

AC POWER SOURCE

BACKGROUND OF THE INVENTION

Electrical power distribution systems manage the allocation of power from energy sources to electrical loads that consume the distributed electrical power. In an aircraft, one or more turbine engines provide for propulsion of the aircraft, and can further provide mechanical energy to generate electricity that ultimately powers a number of different accessories such as generators, starter/generators, permanent magnet alternators (PMAs), fuel pumps, and hydraulic pumps, e.g., equipment for functions needed on an aircraft other than propulsion. For example, contemporary aircraft utilize electrical power for electrical loads related to avionics, motors, and other electric equipment.

BRIEF DESCRIPTION OF THE INVENTION

In one aspect, the present disclosure relates to an alternating current (AC) power source. The AC power source includes a set of power storage units arranged in series and defining a power output, each power storage unit having a respective direct current (DC) dischargeable power storage device, a first selectable connection configured to enable a voltage output of the respective power storage device, and a second selectable connection configured to enable bypassing the voltage output of the respective power storage device, and a controller module communicatively connected with the set of first selectable connections and the set of second selectable connections and configured to selectively enable at least a subset of the first selectable connections or a subset of the second selectable connections, and wherein the selectively enabling emulates an AC waveform at the power output.

In another aspect, the present disclosure relates to a method of generating an alternating current (AC) waveform. The method includes selectively enabling, by a controller module, one of a voltage output connection or a bypass connection for each of a set of dischargeable direct current (DC) power storage units arranged in series such that the summated output of the set of power storage units is provided to a power output, wherein the power output conforms with an emulation AC waveform profile.

DESCRIPTION OF EMBODIMENTS OF THE INVENTION

Figure 1:
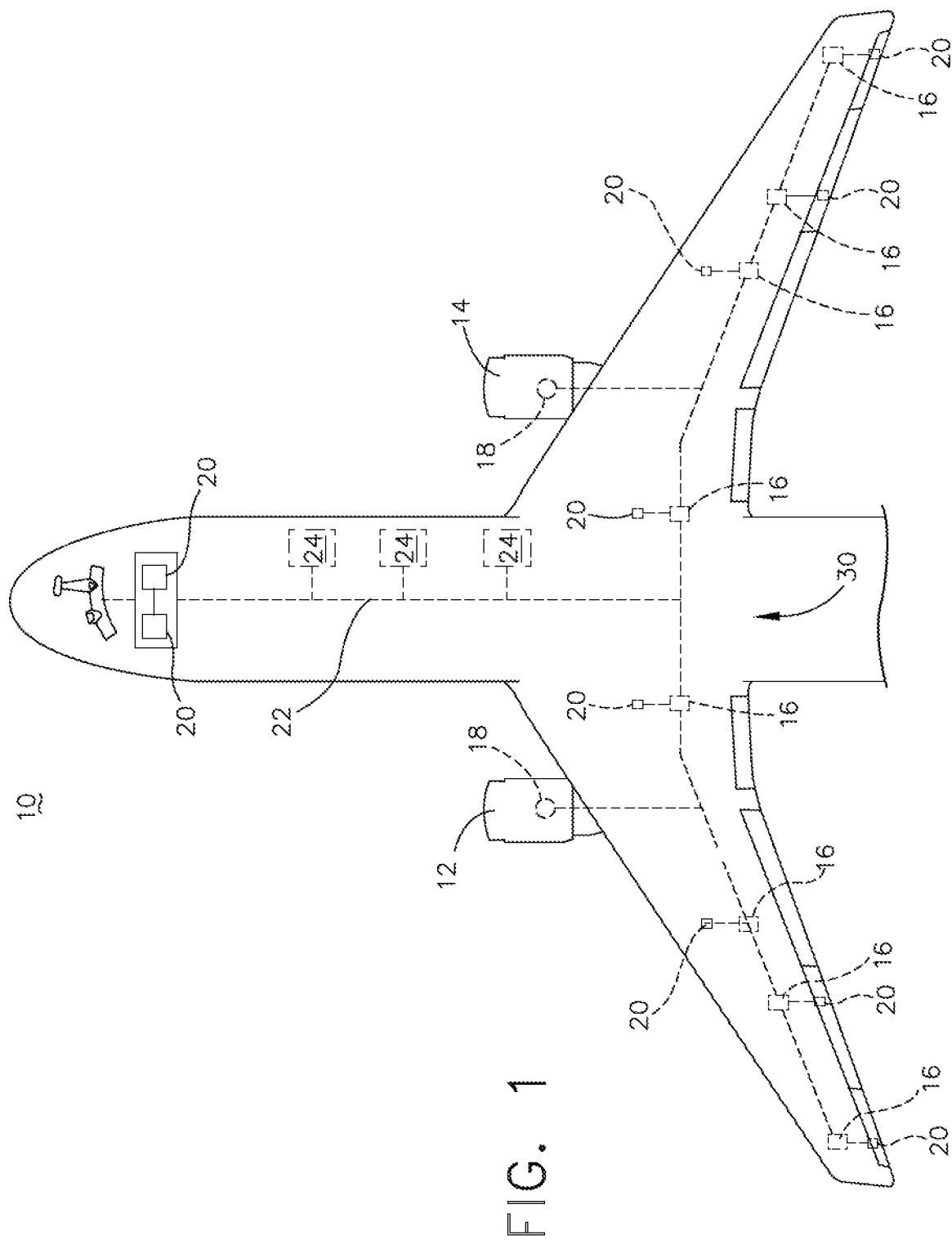
FIG. 1 is a top down schematic view of an aircraft and power distribution system of an aircraft, in accordance with various aspects described herein.

Aspects of the present disclosure are described herein in the context of an aircraft, which enables production of electrical power from an energy source such as a turbine engine, jet fuel, hydrogen, etc. However, it will be understood that the disclosure is not so limited and has general applicability to power distribution systems in non-aircraft applications, including other mobile applications and non-mobile industrial, commercial, and residential applications. For example, applicable mobile environments can include an aircraft, spacecraft, space-launch vehicle, satellite, locomotive, automobile, etc. Commercial environments can include manufacturing facilities or power generation and distribution facilities or infrastructure.

While "a set of" various elements will be described, it will be understood that "a set" can include any number of the respective elements, including only one element. The use of the terms "proximal" or "proximally" refers to moving in a direction toward another component, or a component being relatively closer to the other as compared to another reference point. Also as used herein, while sensors can be described as "sensing" or "measuring" a respective value, sensing or measuring can include determining a value indicative of or related to the respective value, rather than directly sensing or measuring the value itself. The sensed or measured values can further be provided to additional components. For instance, the value can be provided to a controller module or processor, and the controller module or processor can perform processing on the value to determine a representative value or an electrical characteristic representative of said value. Additionally, while terms such as "voltage", "current", and "power" can be used herein, it will be evident to one skilled in the art that these terms can be interchangeable when describing aspects of the electrical circuit, or circuit operations.

Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured, connected, or connectable to provide, enable, disable, or the like, an electrical connection between respective elements. Non-limiting example power distribution bus connections or disconnections can be enabled or operated by way of switching, bus tie logic, or any other connectors configured to enable or disable the energizing of electrical loads downstream of the bus.

As used herein, a "system" or a "controller module" can include at least one processor and memory. Non-limiting examples of the memory can include Random Access Memory (RAM), Read-Only Memory (ROM), flash memory, or one or more different types of portable electronic memory, such as discs, DVDs, CD-ROMs, etc., or any suitable combination of these types of memory. The processor can be configured to run any suitable programs or executable instructions designed to carry out various methods, functionality, processing tasks, calculations, or the like, to enable or achieve the technical operations or operations described herein. The program can include a computer program product that can include machine-readable media for carrying or having machine-executable instructions or data structures stored thereon. Such machine-readable media can be any available media, which can be accessed by a general purpose or special purpose computer or other machine with a processor. Generally, such a computer program can include routines, programs, objects, components, data structures, algorithms, etc., that have the technical effect of performing particular tasks or implement particular abstract data types.

As used herein, a controllable switching element, or a "switch" is an electrical device that can be controllable to toggle between a first mode of operation, wherein the switch is "closed" intending to transmit current from a switch input to a switch output, and a second mode of operation, wherein the switch is "open" intending to prevent current from transmitting between the switch input and switch output. In non-limiting examples, connections or disconnections, such as connections enabled or disabled by the controllable switching element, can be selectively configured to provide, enable, disable, or the like, an electrical connection between respective elements.

The exemplary drawings are for purposes of illustration only and the dimensions, positions, order and relative sizes reflected in the drawings attached hereto can vary.

Referring now to FIG. 1, an aircraft 10 is shown having at least one turbine engine, shown as a left engine system 12 and a right engine system 14. Alternatively, the power system can have fewer or additional engine systems. The left and right engine systems 12, 14 can be substantially identical, and can further include at least one power source, such as a set of respective generators 18. The left and right engine systems 12, 14 can further include another respective power source, such as a second electric machine or set of generators (not shown). Non-limiting aspects of the disclosure can be included wherein, for example, the left engine system 12 includes a first generator 18 as a primary power source and a secondary generator as a secondary, back-up, or redundant power source. The aircraft is shown further having a set of power-consuming components, or electrical loads 20, such as for instance, an actuator load, flight critical loads, and non-flight critical loads.

The electrical loads 20 are electrically coupled with at least one of the generators 18 via a power distribution system 30 including, for instance, power transmission lines 22 or bus bars, and a set of power distribution nodes 16. The aircraft 10 can further include a set of supplemental power sources 24 selectably connectable with the transmission lines 22, and operable to provide at least a portion of primary power, supplemental power, redundant power, backup power, emergency power, or the like. Non-limiting examples of the supplemental power sources 24 can include, but are not limited to, generators, such as auxiliary or emergency power generators, solar panels, fuel cells, batteries, or any other source of electrical power. As shown, the set of supplemental power sources 24 can provide power to the set of transmission lines 22, and thus, the set of power distribution nodes 16 or the set of electrical loads 20.

In the aircraft 10, the operating left and right engine systems 12, 14 provide mechanical energy which can be extracted, typically via a spool, to provide a driving force for the set of generators 18. The set of generators 18, in turn, generate power, such as AC or DC power, and provides the generated power to the transmission lines 22, which delivers the power to the electrical loads 20, positioned throughout the aircraft 10. Furthermore, during operation, the set of supplemental power sources 24 can be selectably connected with the transmission lines 22, and operable to provide primary or supplemental power to a subset of the electrical loads 20.

Example power distribution management functions can include, but are not limited to, selectively enabling or disabling the delivery of power to particular electrical loads 20, depending on, for example, available power distribution supply, criticality of electrical load 20 functionality, or aircraft mode of operation, such as take-off, cruise, or ground operations. During emergency or inadequate periods of electrical power generation, including but not limited to engine or generator failure, at least one of the supplemental power sources 24 can be operated, enabled, or connected for providing power to the electrical loads 20. Additional management functions can be included.

It will be understood that while aspects of the disclosure are shown in an aircraft environment of FIG. 1, the disclosure is not so limited and can have applicability in a variety of environments. For example, while this description is directed toward a power system architecture in an aircraft, aspects of the disclosure can be further applicable to provide power, supplemental power, emergency power, essential power, or the like, in otherwise non-emergency operations, such as takeoff, landing, or cruise flight operations.

Furthermore, the number of, and placement of, the various components depicted in FIG. 1 are also non-limiting examples of aspects associated with the disclosure. For example, while various components have been illustrated with relative position of the aircraft 10 (e.g. the electrical loads 20 on the wings of the aircraft 10, etc.), aspects of the disclosure are not so limited, and the components are not so limited based on their schematic depictions. Additional aircraft 10 configurations are envisioned.

Figure 2:
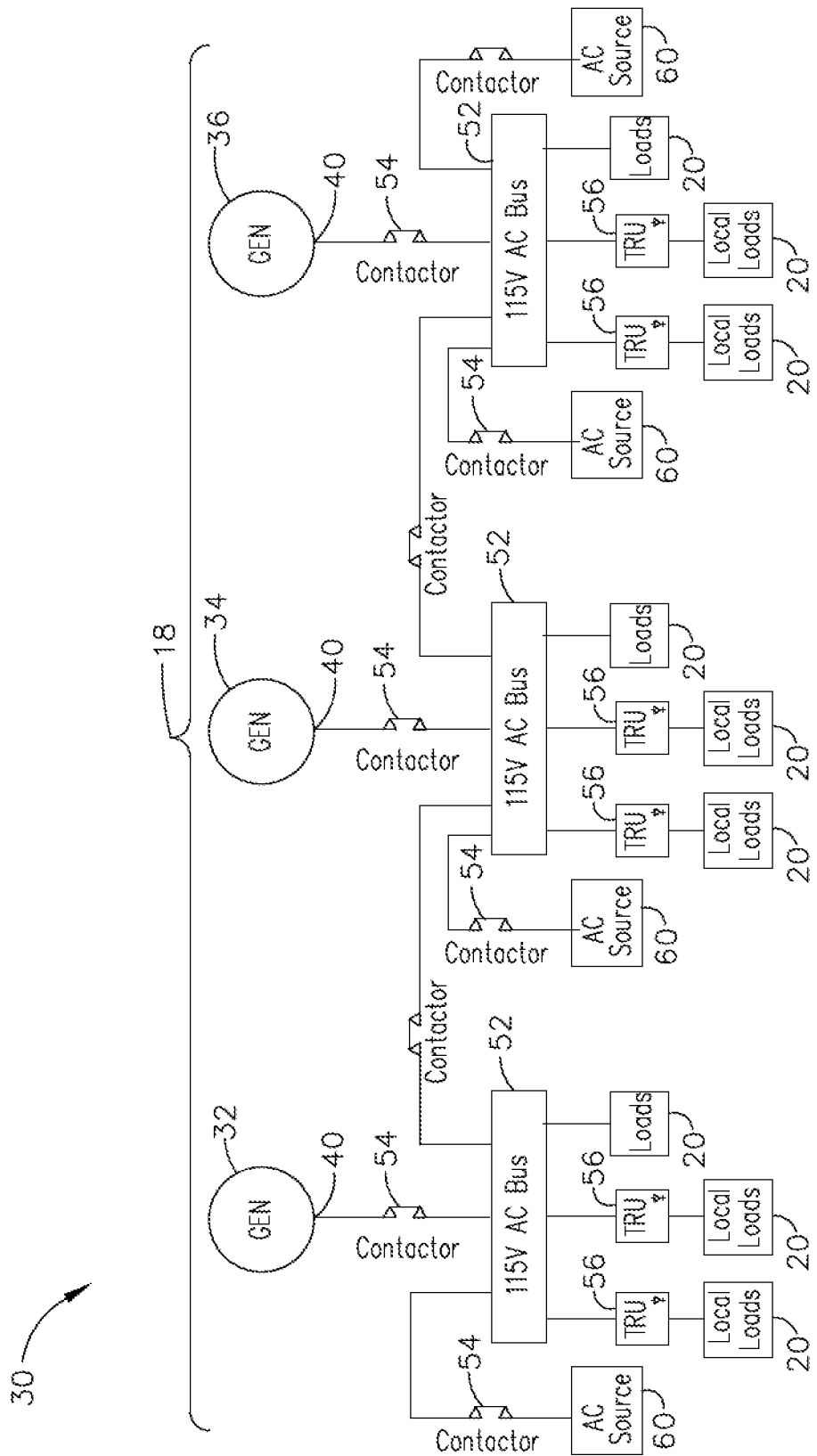
FIG. 2 is a schematic illustration of the power distribution system of the aircraft of FIG. 1, in accordance with various aspects described herein.

Referring now to FIG. 2, a schematic illustration is shown of an exemplary power distribution system 30 that can be utilized in the aircraft 10. The power distribution system 30 is shown having a set of power sources, such as a set of generators 18, including a first generator 32, a second generator 34, and a third generator 36. While three generators 32, 34, 36 are shown, aspects of the disclosure can include any number of generators 18 as desired. In addition, each of the set of generators 18 can include a power output 40 for supplying power to various system components. While the set of generators 18 are illustrated similarly, it is contemplated that the set of generators 18 can supply or generate substantially similar electrical power characteristics or varying electrical power characteristics or have varying power characteristics. In one non-limiting example, the first generator 32 can continuously generate 50 kiloWatts (kW) of electrical power during operation, while the second and third generators 34, 36 can continuously generate 115 kW of alternating current (AC) electrical power at 400 Hz during operation. In another non-limiting example, additional or alternative power sources, such as solar panels (not shown) can be included, and power supplied by the solar panels can be dependent on the weather or cloud cover. In another non-limiting example, traditional generators 18 can operate with different power characteristics depending on environmental conditions such as the solar cycle, temperature, variable-speed power generation, flight phase, maintenance cycles, or the like.

Each generator 32, 34, 36 can be connected via the power outputs 40 to a power bus 52 of the power distribution system 30, such as the transmission lines 22. A contactor 54 can be utilized between each generator 32, 34, 36 and its respective power bus 52 as a relay or switch to selectively supply power to the respective power bus 52. The set of power buses 52 can further be connected with a corresponding set of electrical loads 20. In one non-limiting example, a subset of electrical loads 20 can be connected with a respective power bus 52 by way of at least one transformer rectifier unit (TRU) 56. As used herein, a TRU 56 can be configured or adapted to convert or rectify the electrical power characteristics of the supplied power from the power bus 52 to another, a different, an alternative, or an appropriate electrical power characteristic for a given electrical load 20. In non-limiting examples, the TRU 56 can provide voltage step-up or step-down power conversion, DC to AC power conversion, AC to DC power conversion, or AC to AC power conversion involving changes in frequency or phase. In addition, multiple power buses 52 can be bridged together by way of selectably operable contactors 54, for instance, to tie one power bus 52 with at least another power bus 52.

The power distribution system 30 can also include at least one additional AC power source 60 that can be selectively connected to at least one power bus 52, such as by way of a contactor 54. The AC power source 60 can be configured or adapted to provide a supply electrical power in the same or similar electrical power characteristics as the power sources (e.g. current, voltage, etc.), such as the generators 18. Aspects of the disclosure can be included, however, wherein the total available, peak, or continuous power supply, wattage, or the like, of the AC source 60 can be different from the other power sources.

Figure 3:
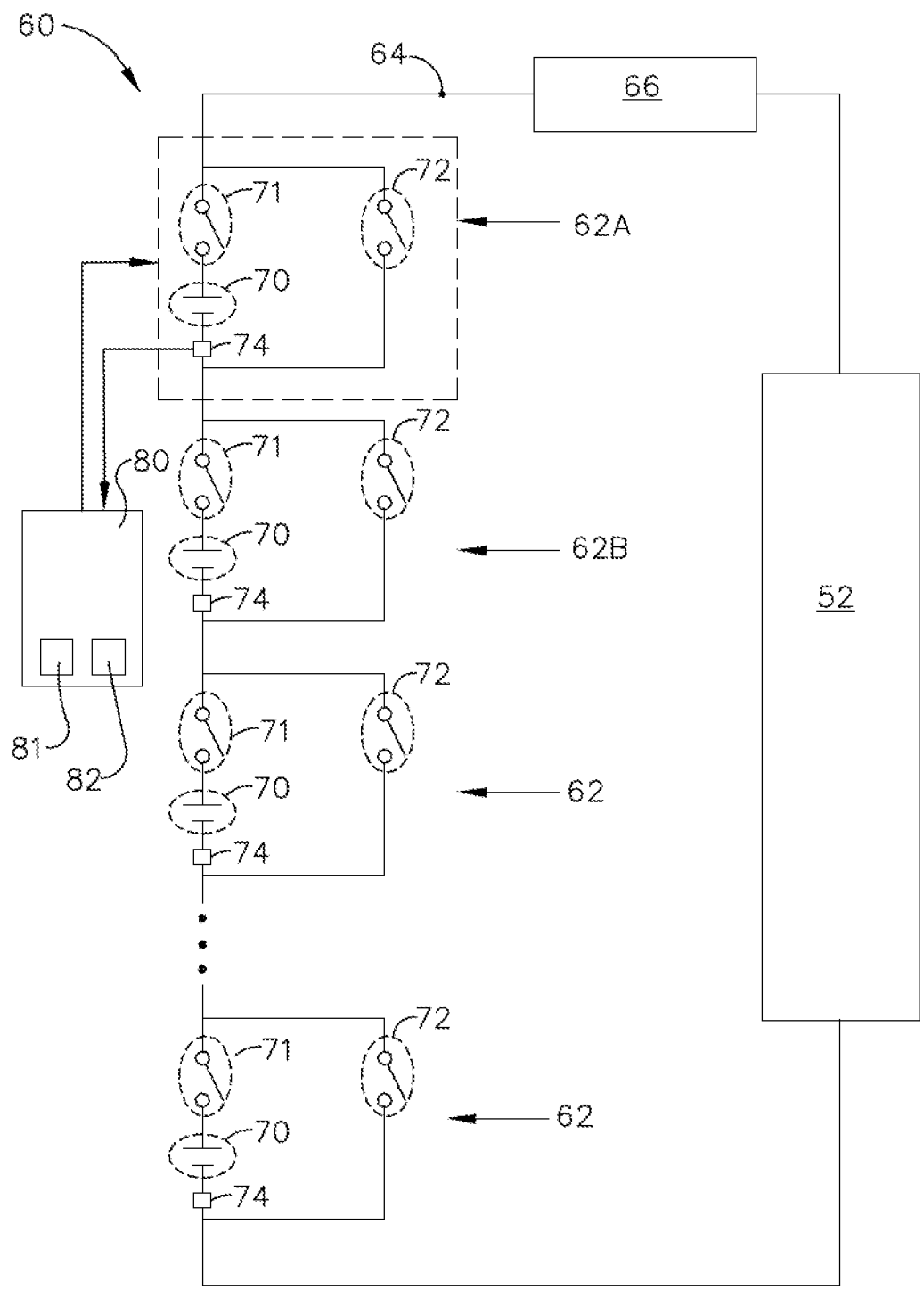
FIG. 3 is a schematic illustration of an AC power source that can be utilized in the power distribution system of FIG. 1, in accordance with various aspects described herein.

Turning to FIG. 3, the AC power source 60 is illustrated where a set of power storage units 62 are arranged in series to define a power output 64 connected with the power bus 52. A power filtering element 66 can also be included in the AC power source 60 at the power output 64. In one non-limiting example, the power filtering element 66 can be configured to smooth sudden increases or decreases in power or voltage output as desired.

Each power storage unit 62 can include at least one DC power storage device 70, a first selectable connection 71 (e.g. a switch) configured or adapted to enable a voltage output of the DC power storage device 70, and a second selectable connection 72 configured or adapted to enable bypassing the voltage output of the DC power storage device 70. Non-limiting examples of the power storage device 70 can include a dischargeable DC power storage device, such as a battery, a battery bank, a battery cell, a super capacitor, a fuel cell, a hydrogen cell, or a continuously or semi-continuous power conversion or supplying device, such as a solar cell, wind turbine, or the like. In another non-limiting example, the power storage device 70 can include a dischargeable or rechargeable power storage device. In one example where the first connection 71 is in an open state and the second connection 72 is in a closed state, the DC power storage device 70 can be bypassed, e.g. not utilizing power stored in the DC power storage device 70 at the power output 64. In another example where the first connection 71 is in a closed state and the second connection 72 is in an open state, the DC power storage device 70 can contribute its supply of power at the power output 64. Furthermore, each power storage unit 62 can also include a power sensor 74 configured to sense a dischargeable power output of the DC power storage device 70.

The AC power source 60 can further include a controller module 80 having a processor 81 and memory 82. The controller module 80 can be communicatively connected with the first selectable connections 71 and second selectable connection 72, as well as the power sensor 74, for each power storage unit 62. FIG. 3 illustrates the controller module 80 connected with only one power storage unit (e.g. a first power storage unit 62A) for brevity and ease of understanding. It is also contemplated that the controller module 80 can be communicatively connected with each of the first and second selectable connections 71, 72 of each power storage unit 62 within the AC power source 60. The controller module 80 can thereby be configured to selectively enable at least a subset of the first selectable connections 71 or a subset of the second selectable connections 72 as desired. Non-limiting aspects of the disclosure can be included wherein one of the first or the second selectable connections 71, 72 is in a closed state at a time. The controller module 80 can further include an AC waveform profile 86, such as by storing in memory 82.

The controller module 80 can be configured to selectively enable a preselected number of first or second selectable connections 71, 72. It can be appreciated that the series connection between the power storage units 70 can provide for an increase or decrease of maximum suppliable voltage at the power output 64. In one non-limiting example, the controller module 80 can controllably enable a first selectable connection 71 of each of a first and second power storage unit 62A, 62B, and also disable a second selectable connection 72 of each of the first and second power storage units 62A, 62B. Correspondingly, the controller module 80 can controllably enable the second selectable connection 72 for each remaining power storage unit 62. In this manner, the first and second power storage units 62A, 62B together can provide their summated power to the power output 64 by their series connection, while the remaining power storage unit 62 voltage outputs are bypassed. It should be understood that the AC power source 60 can include any number of power storage units 62, of which any subset or all units 62 can be controlled by the controller module 80.

Figure 4:
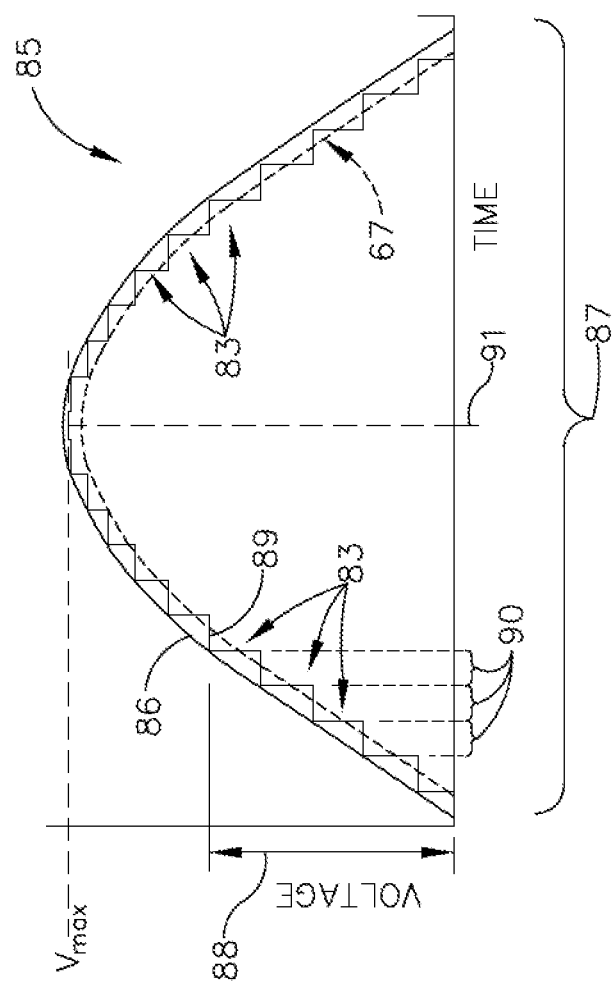
FIG. 4 is a plot illustrating an emulated AC waveform from the AC power source of FIG. 3, in accordance with various aspects described herein.

Turning to FIG. 4, a voltage plot 85 illustrates the AC waveform profile 86 over a time interval 87. As described in FIG. 3, the controller module 80 can selectively enable the first or second selectable connections 71, 72 to produce an overall voltage output 88 at the power output 64 to form at least a portion of the emulated AC waveform 89, which is also illustrated on the voltage plot 85. Furthermore, the power filtering element 66 can smooth the overall voltage output 88 to form an average output waveform 67 (shown in dashed line on the voltage plot 85). As described herein, the AC waveform profile 86 can be considered the "desired" output waveform of the AC power source 60, and the average output waveform 67 can be considered the "actual" output waveform of the AC power source 60. The included illustrations are intended to schematically represent aspects of the disclosure and the waveforms 67, 86, and are purposely distinguishable in the figures for understanding. Aspects of the disclosure can be included wherein, for example, the actual output waveform of the average output waveform 67 tracks, matches, or corresponds with the desired output waveform of the emulation AC waveform profile 86.

In the examples of FIGS. 3 and 4, the controller module 80 can selectively enable or disable the power storage units 62 one by one (as illustrated in stepping voltage increases and decreases 83 of the overall voltage output 88, i.e. the summation of the voltage outputs of the power storage units 62). The controller module 80 can further enable or disable each power storage unit 62 during a set of time step intervals 90. In another non-limiting aspect of the disclosure, the controller module 80 can selectively enable a sufficient number of power storage units 62 to provide a maximum voltage at a peak time 91. More specifically, in one non-limiting example the controller module 80 can provide a maximum voltage of 163 Volts at the peak time 91, and it can be appreciated that the resulting root mean square (RMS) voltage can be approximately 115 Volts. The selective enabling or disabling of the set of power storage units 62 can be at least partially based on attempting to match, relate to, correspond with, mimic, or otherwise emulate the AC waveform profile 86, including by way of incorporating the effects of the power filtering element 66 when forming the average output waveform 67. In one example where no power filtering element is utilized, the controller module 80 can determine a needed stepping voltage 83 to emulate the AC waveform profile 86, and select an appropriate power storage unit 62 for that needed stepping voltage 83. In another example where the power filtering element 66 is enabled or in use, the controller module 80 can determine an effect (e.g. a delay time or averaging amount) of the power filtering element 66 in addition to a needed stepping voltage 83, and select an appropriate power storage 62 accordingly.

It will be understood that while the time steps 90 are illustrated as being approximately equal in duration, the controller module 80 can also vary the duration of the time steps 90 to more closely approximate the AC waveform profile 86, including a sine-wave profile with varying rates of voltage change over the time interval 87. While only a positive half-wave is illustrated in FIG. 4, non-limiting aspects of the disclosure can be included wherein the controller module 80 can be configured to selectively enable a full (e.g. positive and negative half-waves) AC waveform profile 86 having an RMS voltage of 115 Volts at a 400 Hz frequency; other profiles having other voltages or frequencies can also be utilized.

Once the maximum voltage is reached, the controller module 80 can selectively disable (e.g. bypass) a subset of the previously-enabled power storage units 62, e.g. by selectively enabling the second selectable connections 72 to bypass the given power storage unit voltage output. The bypassing thus decreases the overall voltage output 88 over a period of time, a set of time step intervals 90, or a set of stepping voltage decreases 83 until all power storage units 62 are bypassed and no voltage is provided at the power output 64. In this manner, the selective enabling of the first or second selectable connections 71, 72 can emulate the AC waveform profile 86 at the power output 64 of FIG. 3, including by selectively enabling a subset of first or second selectable connections 71, 72 such that the emulated AC waveform 89 at the power output 64 most closely resembles the emulation AC waveform profile 86.

In another non-limiting example, and with continued reference to FIGS. 3 and 4 by way of illustration, it is further contemplated that the controller module 80 can also be configured to receive the sensed dischargeable power output from a power sensor 74, including by way of the processor 81 or memory 82. In this manner the controller module 80 can determine an operating status of the respective DC power storage device 70, such as an amount of dischargeable power remaining in the power storage device 70, an amount of voltage being supplied by the power storage device 70, or whether the power storage device 70 has been bypassed, in non-limiting examples. The controller module 80 can also determine if a DC power storage device 70 has a failed operating status or is otherwise malfunctioning, and can selectively enable the second selectable connection 72 to bypass the malfunctioning DC power storage device 70. Additionally, the controller module 80 can be further configured to selectively enable first or second selectable connections 71, 72 such that the discharge of DC power storage devices 70 is balanced across the set of power storage units 62.

It is further contemplated that the controller module 80 can be configured to sense an available output voltage of each DC power storage device 70 in a set of power storage units 62 which are bypassed at a specific time. The sensing of available output voltage can be accomplished, completed, utilized, or otherwise determined by, for example, the power sensor 74, the controller module 80, or a combination thereof. It can be appreciated that the rate of voltage change in the AC waveform profile 86 may not be constant, and the controller module 80 can selectively enable a power storage unit 62 that will provide for a closest possible emulation of the AC waveform profile 86 based on the sensed available output voltage from the power storage device 70. In one example where a time step 90 is near the peak time 91, a relatively small voltage stepping increase 83 (e.g. 0.5 Volts) may provide the best emulation of the AC waveform profile 86. In such a case, the controller module 80 can sense all available DC power storage devices 70 presently bypassed, and select a suitably-charged power storage device 70 from the set most closely matching the emulation of the AC waveform profile 86 or expected voltage stepping increase 83 (e.g. select the power storage unit 62 or power storage device 70 most closely matching 0.5 Volts). In another example where a time step 90 is not near the peak time 91, a larger voltage stepping decrease 83 (e.g. 1.5 Volts) may be needed for emulation, and the controller module 80 can select an appropriate DC power storage device 70 to bypass. In this manner the time steps 90, or stepping voltage increases or decreases 83, can be suitably varied by the controller module 80 to generate the emulated AC waveform 89.

In yet another non-limiting example, the controller module 80 can be configured or adapted to simultaneously enable and disable a subset of the power storage devices 70 or the power storage units 62 for a closest possible emulation of the AC waveform profile 86 based on the sensed available output voltage from the power storage devices 70. For example, if a presently enabled power storage device 70 has a voltage output of 1.7 Volts, another presently disabled power storage device 70 has a voltage output of 1.8 Volts, and the desired emulation AC waveform calls for a positive step increase of 0.1 Volts, the controller module 80 can disable the 1.7 Volt power storage device 70 or the power storage unit 62, and simultaneously enable the 1.8 Volt power storage device 70 or the power storage unit 62. Aspects of the disclosure can further be included wherein a set of power storage devices 70 or power storage units 62 are simultaneously enabled or disabled to enable the aforementioned desired emulation AC waveform (e.g. more than one power storage devices 70 are simultaneously disabled or more than one power storage devices 70 are simultaneously enabled).

Figure 5:
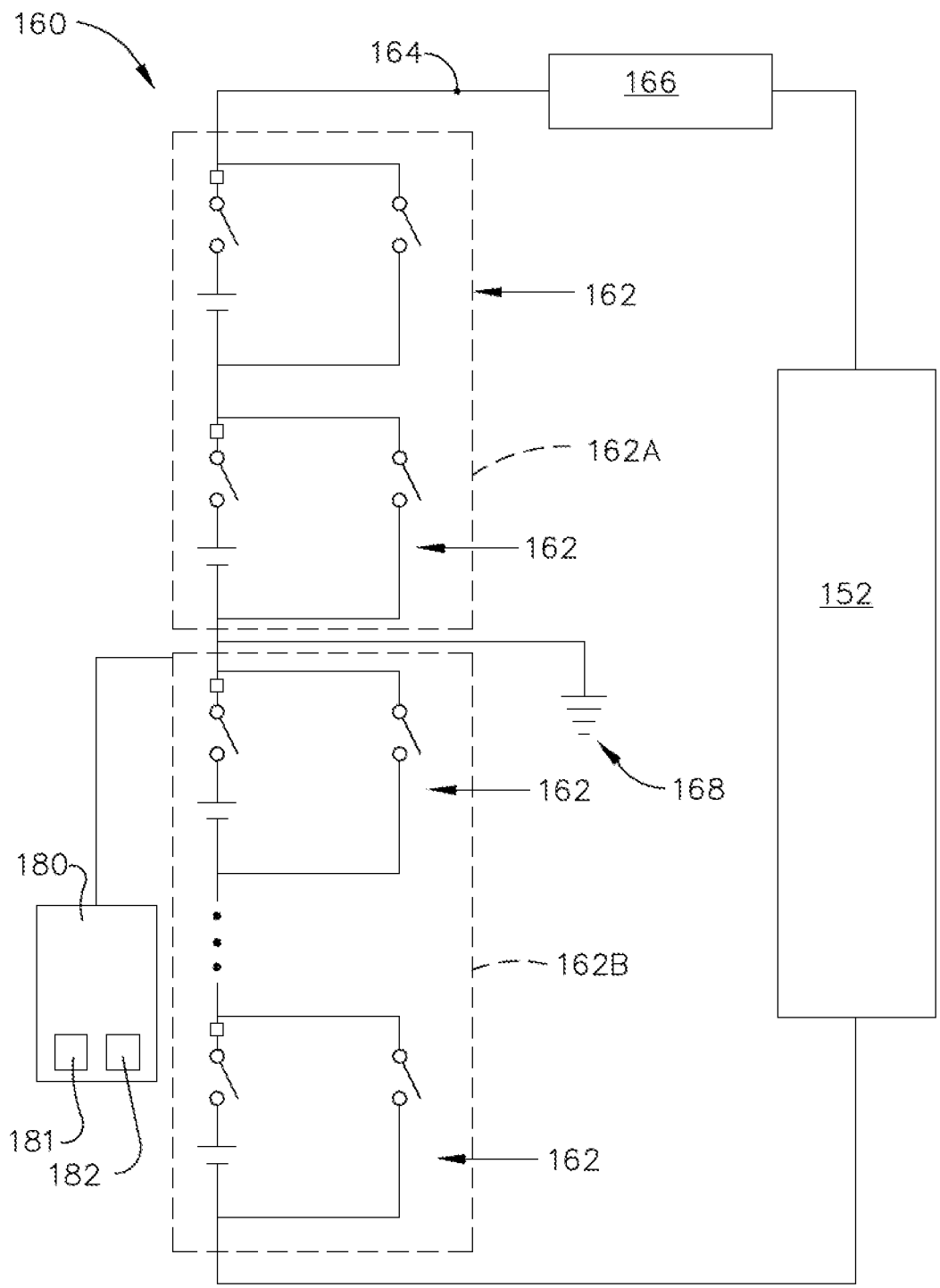
FIG. 5 is a schematic illustration of another AC power source that can be utilized in the power distribution system of FIG. 1 according to various aspects described herein, in accordance with various aspects described herein.

Turning to FIG. 5, another AC power source 160 is illustrated which can be utilized in the power distribution system 30 of FIG. 2. The AC power source 160 is similar to the AC power source 60; therefore, like parts will be identified with like numbers increased by 100, with it being understood that the description of the like parts of the AC power source 60 applies to the AC power source 160, unless otherwise noted.

The AC power source 160 can include a set of power storage units 162 arranged in series to define a power output 164 at a power bus 152. A power filtering element 166 can also be included in the AC power source 60 and configured to smooth sudden increases or decreases in power or voltage output as desired. Each power storage unit 162 can include a DC power storage device 170, a first selectable connection 171 configured to enable a voltage output of the power storage device 70, and a second selectable connection 172 configured to enable bypassing the voltage output of the DC power storage device 170. Further, the AC power source 160 can include a controller module 180 having a processor 181 and memory 182 and communicatively connected with at least one of the first and second selectable connections 171, 172 of each power storage unit 162. The controller module 180 can thereby be configured to selectively enable at least a subset of the first selectable connections 171 or a subset of the second selectable connections 172 as desired. In addition, the controller module 180 can include an AC waveform profile, including by way of storing in memory 82.

An electrical ground 168 can be included in the AC power source 160 to define a first set 162A of power storage units 162 and a second set 162B of power storage units 162, where the first and second sets 162A, 162B are arranged in series and separated by the electrical ground 168, as shown. In addition, each of the power storage units 162 in the first set 162A can include a positive-voltage DC power storage device 170A, and each of the power storage units 162 in the second set 162B can include a negative voltage DC power storage device 170B. Again, while the controller module 180 is shown communicatively connected with only the second set 162A of power storage units 162, non-limiting aspects of the disclosure can be included wherein the controller module 180 can be connected with each of the first and second selectable connections 171 of each power storage unit 162. Additionally, non-limiting aspects of the disclosure can include the aforementioned power sensor (not shown in FIG. 5), described herein, and communicatively connected with the controller module 180.

Figure 6:
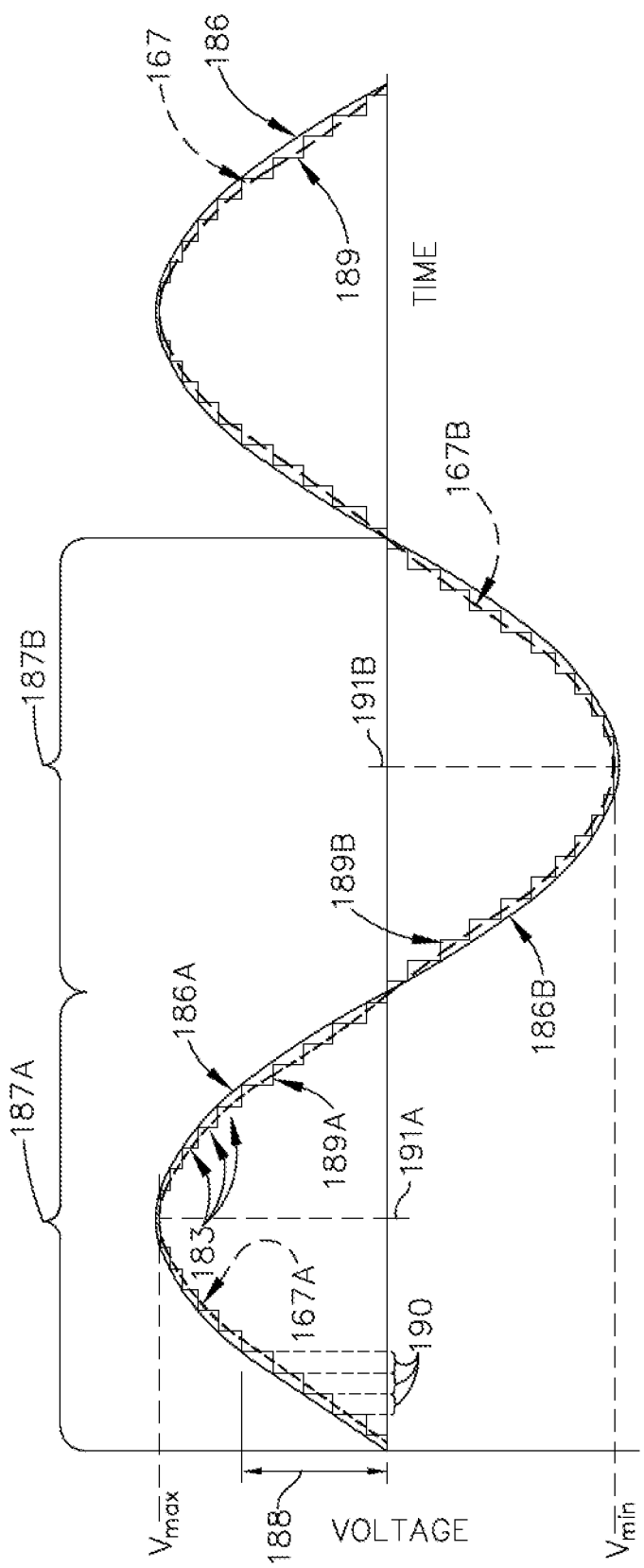
FIG. 6 is a plot illustrating an emulated AC waveform from the AC power source of FIG. 5, in accordance with various aspects described herein.

FIG. 6 demonstrates an example voltage plot 185 illustrating an AC waveform profile 186 for the AC power source 160 of FIG. 5. As shown, a first time interval 187A can define a positive voltage AC waveform 186A and a second time interval 187B can define a negative voltage AC waveform 186B, thereby producing an overall voltage output 188 at the power output 164. In addition, the power filtering element 166 of FIG. 5 can produce an average output waveform 167 (shown in dashed line), including a first average output waveform 167A and a second average output waveform 167B during respective first and second time intervals 187A, 187B. The controller module 180 can be configured to selectively enable the power storage units 162 FIG. 5 over time steps 190 to form an emulated AC waveform 189 in a manner similar to that described in FIGS. 3 and 4. More specifically, the controller module 180 can selectively enable the first set 162A one by one (as illustrated in stepping voltage increases and decreases 183 of the overall voltage output 188) to emulate the positive voltage AC waveform 186A; it can be appreciated that the selective enabling of the first and second selectable connections 171, 172 over time steps 190 in combination with the positive voltage DC power storage devices 170A can produce at least a portion of a first emulated AC waveform 189A that closely resembles the positive voltage AC waveform 186A. The controller module 180 can further enable or disable each power storage unit 162 in the first set 162A to provide a maximum voltage at a peak time 191A, such as 115 Volts. The selective enabling or disabling of the first set 162A of power storage units 162 can be at least partially based on attempting to match, relate to, correspond with, mimic, or otherwise emulate the positive voltage AC waveform 186A. In a manner similar to that described in FIG. 4, the controller module 180 can also account for additional effects or behavior of the power filtering element 166 in generating the average output waveform 167, and selective enabling of disabling of power storage units 162 can also be performed by the controller module 180 based on these effects as desired.

Further, the controller module 180 can also be configured to selectively enable the selectable connections 171, 172 of the second set 162B (FIG. 5) one by one, in a similar manner as described above, to produce a second emulated AC waveform 189B that closely resembles the negative voltage AC waveform 186B. The controller module 180 can further enable or disable each power storage unit 162 in the second set 162B to provide a minimum voltage at a minimum time 191B, such as −115 Volts. The selective enabling or disabling of the second set 162B of power storage units 162 can also be at least partially based on attempting to match, relate to, correspond with, mimic, or otherwise emulate the negative voltage AC waveform 186B.

It is contemplated that the controller module 180 can selectively operate power storage units 162 to produce the first and second emulated AC waveforms 189A, 189B in an alternating fashion, thereby emulating the sinusoidal nature of the AC waveform profiles 186. It should also be understood that the controller module 180 can vary the duration of selected time steps 190 to more closely emulate the AC waveform profile 186.

Figure 7:
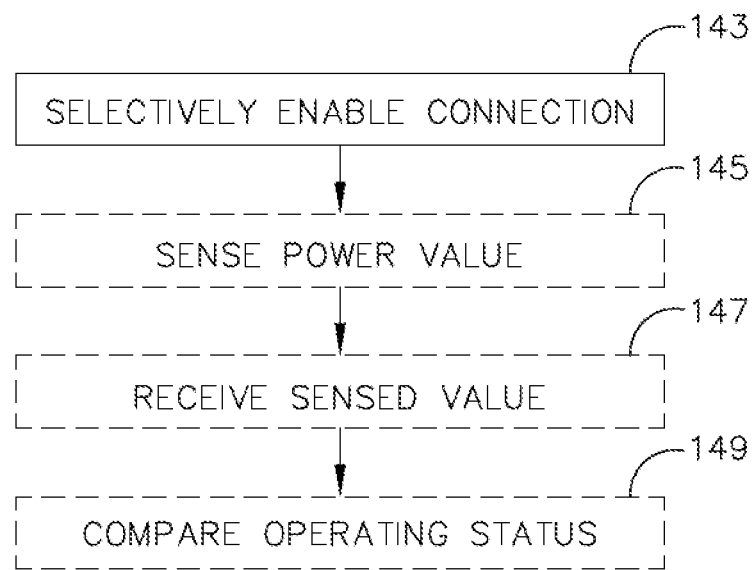
FIG. 7 is a flowchart illustrating a method of generating an AC waveform in the power distribution system of FIG. 1, in accordance with various aspects described herein.

Turning to FIG. 7, a method 141 of generating an AC waveform is illustrated, including the AC waveform profile 86 of FIG. 4. The method 141 includes selectively enabling by the controller module 80 one of a voltage output connection, e.g. the first selectable connection 71, or a bypass connection, e.g. the second selectable connection 72, for each of the set of power storage units 62, which can be arranged in series such that the summated output of the set of power storage units 62 is provided to the power output 64, and the power output 64 conforms with the emulation AC waveform profile 86, at 143. Optionally, the method 141 can further include, for example, sensing a dischargeable power value for at least a subset of the dischargeable power storage units 64 at 145. Optionally, the method 141 can yet further include receiving the sensed dischargeable value from the power sensor 74 as well as determining an operating status of the subset of power storage units 64, at 147. In yet another optional step, the method 141 can include comparing the operating status of the subset of power storage units 64 with the AC waveform profile 86 and selectively enable power storage units 64 such that the power output (e.g. the emulated AC waveform 89 of FIG. 4) most closely resembles the AC waveform profile 86 at 149. The controller 180 of FIG. 5 can also selectively enable a voltage output connection (e.g. the first selectable connection 171) or a bypass connection (e.g. the second selectable connection 172) for each of the set of positive or negative voltage DC positive storage devices 170A, 170B within the first and second set 162A, 162B of power storage units 162 (FIG. 5). Furthermore, the controller 180 can selectively enable at least a subset of the first set 170A or the second set 170B such that the power output conforms with the first emulated AC waveform 189A or with the second emulated AC waveform 189B.

Figure 8:
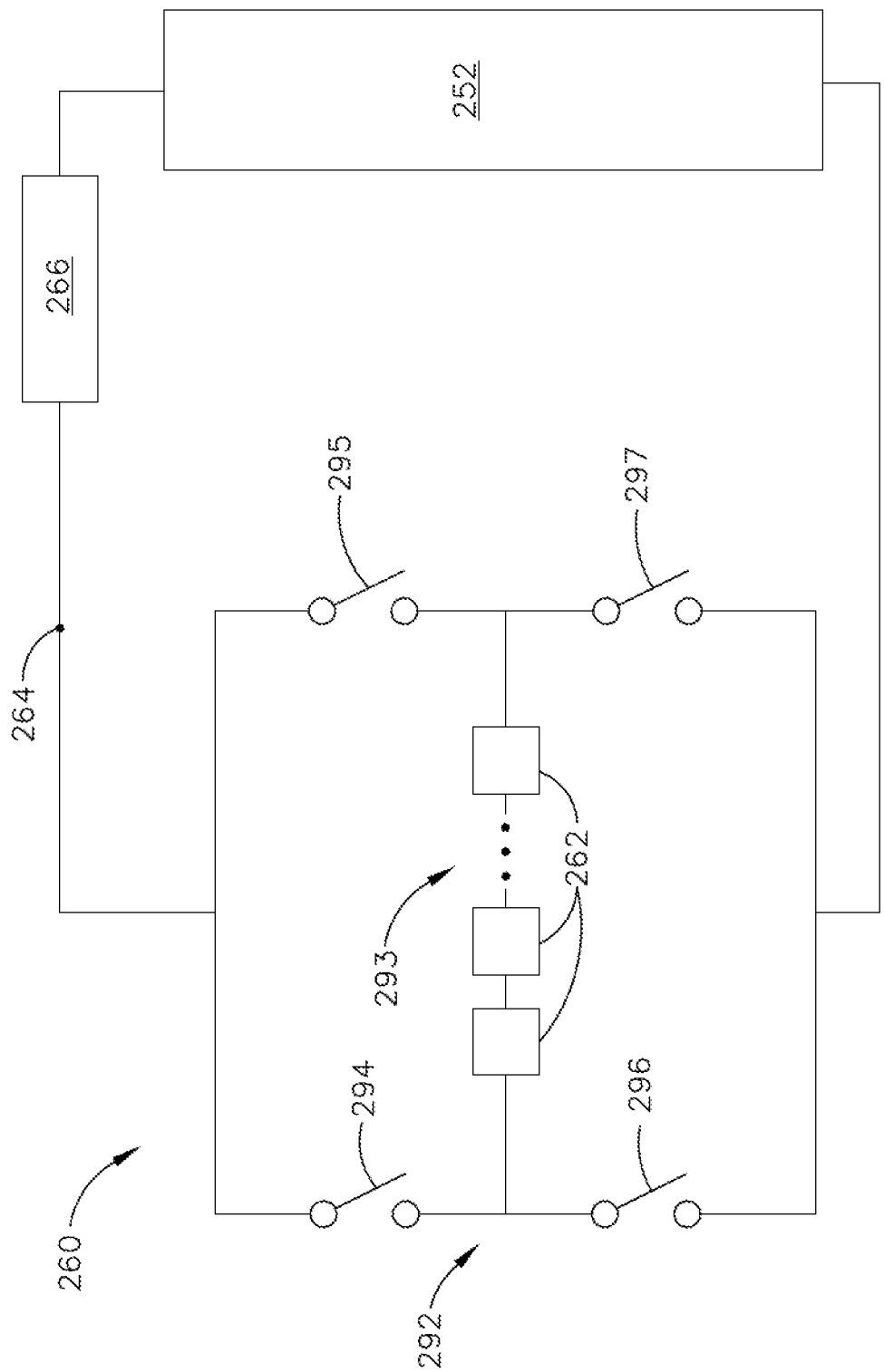
FIG. 8 is a schematic illustration of another AC power source that can be utilized in the power distribution system of FIG. 1, in accordance with various aspects described herein.

FIG. 8 illustrates another AC power source 260 that can be utilized in the power distribution system 30 of FIG. 1. The AC power source 260 is similar to the AC power source 60; therefore, like parts will be identified with like numbers increased by 200, with it being understood that the description of the like parts of the AC power source 60 applies to the AC power source 260, unless otherwise noted.

The AC power source 260 can include an H-bridge 292 having a center leg 293, a first switch 294, a second switch 295, a third switch 296, and a fourth switch 297. A set of power storage units 262 can be connected in series across the center leg 293, and the H-bridge 292 can be coupled to a power bus 252 at a power output 264, including by way of a power filtering element 266.

In addition, a controller module (not shown), similar to the controller modules 80, 180 previously described, can be configured to controllably operate any of the power storage units 262 as well as any or all of the switches 294, 295, 296, 297. In this manner the controller module can controllably operate the H-bridge 292 to emulate a positive or negative AC waveform at the power output 264. In one example, enabling the first and fourth switches 294, 297 while disabling the second and third switches 295, 296 can emulate a positive-voltage AC waveform. In another example, disabling the first and fourth switches 294, 297 while enabling the second and third switches 295, 296 can emulate a negative voltage AC waveform. Other examples in the spirit of the present disclosure are contemplated for use in the power distribution system 30 of FIG. 2.

Figure 9:
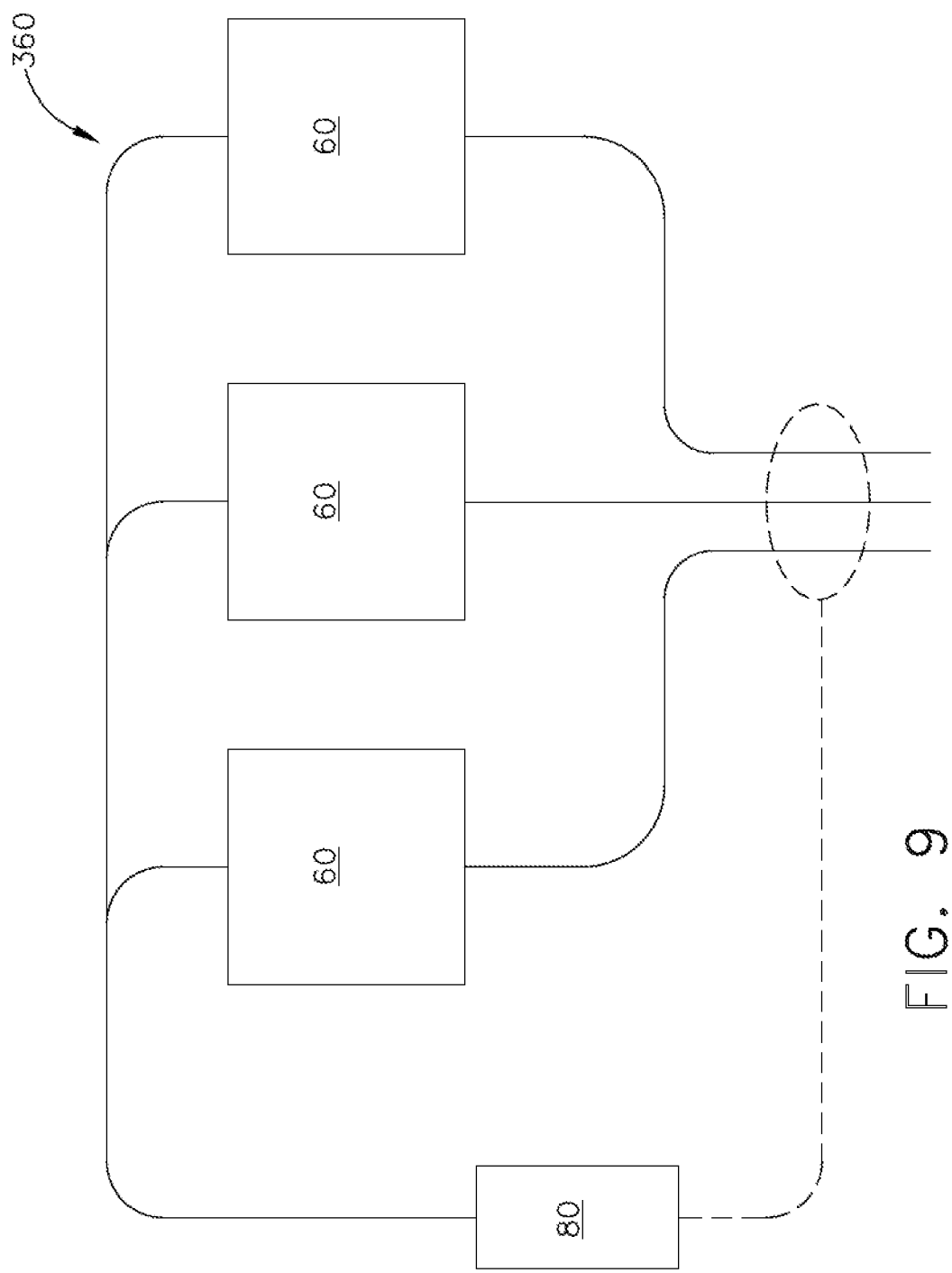
FIG. 9 illustrates a three-phase AC power source that can be utilized in the power distribution system of FIG. 1, in accordance with various aspects described herein.

Referring now to FIG. 9, a multiple-phase AC power source 360 is illustrated which utilizes a set of AC power sources 60 as illustrated in FIG. 3. It will be understood that any of the AC power sources 60, 160, 260 as described herein can also be utilized in the multiple-phase AC power source 360. The multiple-phase AC power source 360 is illustrated and described as a three-phase AC power source, and it will be understood that aspects of the disclosure can be included to grouped a set of AC power sources 60, 160, 260 into any number of phase-outputs, including, but not limited to, two-phase, four-phase, six-phase outputs, or the like.

The multiple-phase AC power source 360 is illustrated in the example of FIG. 9 as including three AC power sources 60 independently controlled by the controller module 80, which can be further configured as a three-phase controller to selectively operate the AC power sources 60 as well as monitor the combined output of the AC power sources 60 (illustrated schematically in dashed line). In one non-limiting example, the AC power sources 60 can be controlled to each emulate or generate 115 Volts at three different phases or phase angles, e.g. at 0 degrees, 120 degrees, and 240 degrees.

It is further contemplated that the power distribution system 30 can include any combination of AC power sources 60, 160, 260, 360 to emulate an AC waveform by way of DC power storage devices.

Aspects of the disclosure described herein provide for a variety of benefits. Traditional AC power sources, including those commonly found in an aircraft environment e.g. a rotating generator, typically utilize an inverter which can increase circuit complexity and inhibit direct connection of the power source to the distribution network. The use of controller-operated DC power storage devices provides for emulation of the output from a traditional AC power source without need of inverter circuitry, and can also allow for direct connection to the power distribution system. Positive and negative voltages can be formed by way of the ground connection partway through the stack of power storage units as shown in FIG. 5, or by way of an H-bridge as shown in FIG. 8. Careful timing or coordination of the power storage units can provide for improved emulation of the AC waveform, and the operating status of the power storage units can be accounted for by the controller to generate uniform, repeatable power output in a variety of environmental conditions or charge levels within the DC power storage devices.

To the extent not already described, the different features and structures of the various aspects can be used in combination with each other as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the described disclosure, including the best mode, and also to enable any person skilled in the art to practice aspects of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An alternating current (AC) power source, comprising:
a set of power storage units arranged in series and defining a power output including a first set of power storage units having a positive voltage DC dischargeable power storage device and a second set of power storage units having a negative voltage DC dischargeable power storage device, each of the first and second sets of power storage units having a first selectable connection configured to enable a voltage output of the respective power storage device and a second selectable connection configured to enable bypassing the voltage output of the respective power storage device, wherein the first set of power storage units are arranged in series with the second set of power storage units, and wherein the first and second sets of power storage units are separated by an electrical ground; and
a controller module communicatively connected with the set of first selectable connections and the set of second selectable connections and configured to selectively enable at least a subset of the first selectable connections or a subset of the second selectable connections, and wherein the selectively enabling emulates an AC waveform at the power output.

2. The AC power source of claim 1 wherein each power storage unit further includes a power sensor configured to sense a dischargeable power output of the respective power storage device.

3. The AC power source of claim 2 wherein the controller module is configured to receive the sensed dischargeable power output for the respective power storage device and determine an operating status of the respective power storage device.

4. The AC power source of claim 3 wherein the controller module includes an emulation AC waveform profile.

5. The AC power source of claim 4 wherein the controller module is configured to sense the dischargeable power output of a set of respective power storage devices, compare the dischargeable power outputs of the set of power storage devices with the emulation AC waveform profile, and selectably enable the subset of the first or second selectable connections such that the emulated AC waveform at the power output most closely resembles the emulation AC waveform profile.

6. The AC power source of claim 3 wherein the controller module is configured to selectively enable the second selectable connection to bypass respective power storage devices determined to have a failed operating status.

7. The AC power source of claim 1 wherein the controller module is configured to selectively enable the subset of first or second selectable connections such that the discharge of power storage devices is balanced across the set of power storage units.

8. The AC power source of claim 1 wherein the controller module is configured to selectively enable at least a subset of the first set of power storage units to emulate a positive voltage AC waveform at the power output and to selectively enable at least a subset of the second set of power storage units to emulate a negative voltage AC waveform at the power output.

9. The AC power source of claim 1, further comprising an H-bridge, wherein the set of power storage units are positioned across a center leg of the H-bridge.

10. The AC power source of claim 9, wherein the controller module is further configured to controllably operate the H-bridge to emulate a positive AC waveform at the power output and a negative AC waveform at the power output.

11. The AC power source of claim 1 further comprising a power filtering element at the power output.

12. The AC power source of claim 1 further comprising at least two sets of power storage units, wherein the controller module is further configured to selectably enable the at least two sets of power storage units to emulate a corresponding at least two phases of power.

13. A method of generating an alternating current (AC) waveform, the method comprising:
selectively enabling, by a controller module, one of a voltage output connection or a bypass connection for each of a first set of power storage units having a positive voltage DC dischargeable power storage device and a second set of power storage units having a negative voltage DC dischargeable power storage device, wherein the first set of power storage units are arranged in series with the second set of power storage units, and wherein the first and second sets of power storage units are separated by an electrical ground, such that the summated output of each of the first set of power storage units and second set of power storage units is provided to a power output, wherein the power output conforms with an emulation AC waveform profile.

14. The method of claim 13, further comprising sensing, by a power sensor, a dischargeable power value for at least a subset of the first and second power storage units.

15. The method of claim 14, further comprising receiving the sensed dischargeable value from the sensor for the subset of the first and second power storage units, and determining an operating status of the subset of dischargeable the first and second power storage units.

16. The method of claim 15, further comprising comparing the operating status of the subset of dischargeable power storage units with the emulation AC waveform profile, and the selectively enabling includes selectively enabling a subset of the dischargeable power storage units such that the power output most closely resembles the emulation AC waveform profile.

17. The method of claim 13 wherein selectively enabling further includes selectively enabling one of the voltage output connection or a bypass connection for each of a first set of positive voltage dischargeable DC power storage units or a second set of negative voltage dischargeable DC power storage units, the sets of positive and negative voltage dischargeable DC power storage units arranged in series.

18. The method of claim 17 wherein the selectively enabling further includes selectively enabling at least a subset of the first set of positive voltage dischargeable DC power storage units such that the power output conforms with a positive voltage waveform of the emulation AC waveform profile and selectively enabling at least a subset of second set of negative voltage dischargeable DC power storage units such that the power output conforms with a negative voltage waveform of the emulation AC waveform profile.

* * * * *